(12) United States Patent
Zhao et al.

(10) Patent No.: US 9,835,917 B2
(45) Date of Patent: Dec. 5, 2017

(54) BASEPLATE CIRCUIT AND DISPLAY PANEL

(71) Applicant: WUHAN CHINA STAR OPTOELECTRONICS TECHNOLOGY CO., LTD., Wuhan, Hubei (CN)

(72) Inventors: Mang Zhao, Hubei (CN); Yong Tian, Hubei (CN)

(73) Assignee: WUHAN CHINA STAR OPTOELECTRONICS TECHNOLOGY CO., LTD., Wuhan (CN)

(*) Notice: Subject to any disclaimer, the term of this patent is extended or adjusted under 35 U.S.C. 154(b) by 150 days.

(21) Appl. No.: 14/773,355

(22) PCT Filed: Aug. 11, 2015

(86) PCT No.: PCT/CN2015/086588
§ 371 (c)(1),
(2) Date: Sep. 7, 2015

(87) PCT Pub. No.: WO2017/015989
PCT Pub. Date: Feb. 2, 2017

(65) Prior Publication Data
US 2017/0153522 A1    Jun. 1, 2017

(30) Foreign Application Priority Data

Jul. 29, 2015   (CN) .......................... 2015 1 0458290

(51) Int. Cl.
*G01R 31/28*    (2006.01)
*G02F 1/1345*    (2006.01)
(Continued)

(52) U.S. Cl.
CPC ... *G02F 1/136286* (2013.01); *G01R 31/2825* (2013.01); *G02F 1/1368* (2013.01);
(Continued)

(58) Field of Classification Search
CPC .... G02F 1/13452; H05K 1/117; H05K 1/147; H05K 2201/09781
See application file for complete search history.

(56) References Cited

U.S. PATENT DOCUMENTS 8,268,654 B2 *   9/2012  Fujikawa ............ H01L 27/1214
257/59
2005/0264503 A1   12/2005  Wu et al.
(Continued)

FOREIGN PATENT DOCUMENTS

CN   101315508    * 12/2008
CN   101315508 A   12/2008
(Continued)

*Primary Examiner* — Raj R Gupta
(74) *Attorney, Agent, or Firm* — Soroker Agmon Nordman

(57) ABSTRACT

A baseplate circuit is disclosed. The baseplate comprises an IC region, a plurality of WOA regions, a plurality of GOA regions, and a plurality of switches. Each WOA region comprises a plurality of baseplate conducting wires, each of the baseplate conducting wires is electrically connected with the IC region. Each GOA region comprises a plurality of gate lines, each of the gate lines is electrically connected with one of the baseplate conducting wires. Each of the switches is used to electrically connect one of the gate lines and one of the baseplate conducting wires.

17 Claims, 4 Drawing Sheets

(51) Int. Cl.
　　　*G02F 1/1362*　　　(2006.01)
　　　*G02F 1/1368*　　　(2006.01)
　　　*H01L 21/66*　　　(2006.01)
　　　*H01L 27/12*　　　(2006.01)
　　　*H01L 29/786*　　　(2006.01)
　　　*G09G 3/00*　　　(2006.01)

(52) U.S. Cl.
　　　CPC ......... *G02F 1/13454* (2013.01); *G09G 3/006* (2013.01); *H01L 22/34* (2013.01); *H01L 27/124* (2013.01); *H01L 27/1222* (2013.01); *H01L 29/78672* (2013.01); *G02F 2001/136254* (2013.01); *G02F 2202/104* (2013.01); *G09G 2330/12* (2013.01)

(56) References Cited

U.S. PATENT DOCUMENTS

2011/0240988 A1* 10/2011 Yano ................. H01L 29/78609
　　　　　　　　　　　　　　　　　　　　　　　　257/43
2016/0125775 A1　　5/2016　Lv

FOREIGN PATENT DOCUMENTS

| CN | 102629440 A | 8/2012 |
| CN | 104062784 A | 9/2014 |
| CN | 104299547 A | 1/2015 |

\* cited by examiner

BASEPLATE CIRCUIT AND DISPLAY PANEL

BACKGROUND OF THE INVENTION

Field of Invention

The present invention relates to the field of liquid crystal display technology, and more particularly to a baseplate and a display panel based on an LTPS (Low-Temperature Poly-Si) panel, which is especially used for signal testing.

Description of Prior Art

With the development of LTPS semi-conductor thin-film transistors and their characteristic extremely high carrier mobility, integrated circuits surrounding the panel become a focus of the industry. Lots of research into SOP (System on Panel) is emerging, which is making SOP become reality step by step.

In a general panel-design process, cell test circuits are limited to testing a panel after box formation, with a lower utilization rate.

In a testing process to a driving signal by using a conventional cell test circuit, a loading of a GOA (Gate on Array) of a panel extremely influences an RC loading of the driving signal, and influences a test of a low RC loading oscillogram while passing through a WOA (Wire on Array) region from an IC (Integrated Chip).

Refer to FIG. 1, which is an illustrative diagram of a baseplate circuit of a conventional display panel. The base plate comprises an active region 11, a GOA region 18, a fanout region 12, a WOA region 13, an IC region 14, a FPC (Flexible Printed Circuit) region 15, and a cell test region 16. The active region 11 is used to display a pixel. The GOA region is used to generate gate driving signals of thin film transistors inside the panel. The fanout region 12 is used to wire data lines between the IC region 14 and the active region 11. The cell test region 16 comprises a plurality of testing pads 17, and the cell test region 16 is used to test display effects of the cells. The WOA region 13 is used to connect wires surrounding the panel. The IC region 14 is used to connect ICs, and to drive circuits and thin film transistors inside the panel. The FPC region 15 is used to connect to a main board.

FIG. 2 is an illustrative drawing of the pixel test circuit of FIG. 1. When performing the pixel test, the IC region 14 is unconnected. Signals are inputted into wirings of the WOA region 13, then connected with the wirings of the GOA region 18 through the wirings of the WOA region 13 to drive the active region 11. According to FIG. 2, in the panel design, the signal lines are needed to wire out from the IC region 14 corresponding with the signal lines of the cell test region 16 in order to perform a driving control of the panel 10 by the IC region 14 through after the IC region is connected.

In the conventional panel, the plurality of testing pads 17 shown in FIG. 2 are used to test signals. The signal tested is a waveform after passing through a high RC loading of the WOA region 13 and the GOA region 18. If the RC loading is malfunctioned, it is hard to determine whether a problem is in the WOA region 13 or the GOA region 18.

So, there is a need to provide a technical proposal to solve the above problem.

SUMMARY OF THE INVENTION

The present invention provides a method to perform a panel driving signal measurement by signal testing pads. A circuit of the present invention disposes a TFT control module between the signal liness and the GOA module, the TFT control module is used to control the signals inputted into the GOA, to achieve an effective control on the panel driving signal.

A circuit design of the present invention not only achieves precise monitoring and measurements of a waveform outputted after a high RC loading of a WOA region and a GOA region, but also a waveform outputted after a low RC loading of the WOA region. When a measured high RC loading signal is not able to satisfy the driving of gate lines, with comparison of the waveforms of a low RC loading and a high RC loading, it is easy to determine the malfunctioned region (WOA region or GOA region), and will be a powerful reference for product design.

An objective of the present invention is to provide a baseplate circuit disposed in a baseplate, especially for signal testing.

In order to achieve the objective, the present invention provides a baseplate circuit, the baseplate comprises an IC region, a plurality of WOA regions, a plurality of GOA regions, a plurality of switches, an active region, a FPC region, and an external connecting region.

Each WOA region comprises a plurality of baseplate conducting wires, each of the baseplate conducting wires is electrically connected with the IC region. Each GOA region comprises a plurality of gate lines, each of the gate lines is electrically connected with one of the baseplate conducting wires. Each of the switches is used to electrically connect one of the gate lines and one of the baseplate conducting wires. The active region is used to connect with the GOA regions. The active region comprises a plurality of pixel units, the pixel units are connected with GOA regions and a plurality of data lines of the IC region. The FPC region is used to connect with an external assembly module. The external connecting region is used to accommodate the data lines, which are used to connect the active region and the IC region. The IC region outputs a control signal, which is used to selectively switch on/off the switches. The IC region further outputs a testing signal, which is used to pass through the WOA regions and the GOA regions or the WOA regions only, according to the control signal. The baseplate is a glass baseplate.

In one embodiment, each of the switches comprises a TFT (thin film transistor), the TFT comprises a first terminal, a second terminal, and a control terminal. The first terminal connects with one of the baseplate conducting wires, the second terminal connects with one of the gate lines.

In one embodiment, the baseplate circuit further comprises a plurality of pixel testing regions, each pixel testing region comprises a first testing pad and a plurality of second testing pads. The first testing pad is used to electrically connect the control terminal and the IC region. Each of the second testing pads is electrically connected with the first terminal of the TFT.

In one embodiment, the first terminal is a source electrode, and the second terminal is a drain electrode and the control terminal is a gate electrode.

An objective of the present invention is to provide a baseplate circuit disposed in a baseplate, especially for signal testing.

In order to achieve the objective, the present invention provides a baseplate circuit, the baseplate comprises an IC region, a plurality of WOA regions, a plurality of GOA regions, and a plurality of switches.

Each WOA regions comprises a plurality of baseplate conducting wires, each of the baseplate conducting wires is electrically connected with the IC region. Each GOA region comprises a plurality of gate lines, each of the gate lines is electrically connected with one of the baseplate conducting wires. Each of the switches is used to electrically connect one of the gate lines and one of the baseplate conducting wires.

In one embodiment, the baseplate circuit further comprises an active region used to connect with the GOA regions. The active region comprises a plurality of pixel units, the pixel units are connected with GOA regions and a plurality of data lines of the IC region.

In one embodiment, the baseplate is a glass baseplate.

In one embodiment, the baseplate circuit further comprises a FPC region used to connect with an external assembly module.

In one embodiment, the baseplate circuit further comprises an external connecting region used to accommodate the data lines, which are used to connect the active region and the IC region. In one embodiment, each of the switches comprises a TFT (thin film transistor), the TFT comprises a first terminal, a second terminal, and a control terminal, the first terminal connects with one of the baseplate conducting wires, the second terminal connects with one of the gate lines.

In one embodiment, the baseplate circuit further comprises a plurality of pixel testing regions, each pixel testing region comprises a first testing pad and a plurality of second testing pads. The first testing pad is used to electrically connect the control terminal and the IC region. Each of the second testing pads is electrically connected with the first terminal of the TFT.

In one embodiment, the first terminal is a source electrode, the second terminal is a drain electrode and the control terminal is a gate electrode.

In one embodiment, the IC region outputs a control signal, which is used to selectively switch on/off the switches.

An objective of the present invention is to provide a display panel.

In order to achieve the objective, the present invention provides a display panel, which comprises a baseplate circuit and a main board. The main board connects with the baseplate circuit and provides display information which the baseplate need. The baseplate comprises an IC region, a plurality of WOA regions, a plurality of GOA regions, a plurality of switches, an active region, a FPC region, and an external connecting region.

Each WOA regions comprises a plurality of baseplate conducting wires, each of the baseplate conducting wires is electrically connected with the IC region. Each GOA region comprises a plurality of gate lines, each of the gate lines is electrically connected with one of the baseplate conducting wires. Each of the switches is used to electrically connect one of the gate lines and one of the baseplate conducting wires. The active region is used to connect with the GOA regions. The active region comprises a plurality of pixel units, the pixel units are connected with GOA regions and a plurality of data lines of the IC region. The FPC region is used to connect with an external assembly module. The external connecting region is used to accommodate the data lines, which are used to connect the active region and the IC region. The IC region outputs a control signal, which is used to selectively switch on/off the switches. The IC region further outputs a testing signal, which is used to pass through the WOA regions and the GOA regions or the WOA regions only, according to the control signal. The baseplate is a glass baseplate.

In one embodiment, each of the switches comprises a TFT (thin film transistor), the TFT comprises a first terminal, a second terminal, and a control terminal. The first terminal connects with one of the baseplate conducting wires, the second terminal connects with one of the gate lines.

In one embodiment, the baseplate circuit further comprises a plurality of pixel testing regions, each pixel testing region comprises a first testing pad and a plurality of second testing pads. The first testing pad is used to electrically connect the control terminal and the IC region. Each of the second testing pads is electrically connected with the first terminal of the TFT.

In one embodiment, the first terminal is a source electrode, the second terminal is a drain electrode and the control terminal is a gate electrode.

With the above technical proposal of the present invention, the advantageous effects are as below:

1. Raising effective usage ratio of the pixel testing circuit.
2. With comparison of the waveforms of the high RC loading and the low RC loading, it is easy to determine the malfunctioned region (WOA region or GOA region), and will be a powerful reference for product design.

DETAILED DESCRIPTION OF THE PREFERRED EMBODIMENTS

Figure 1:
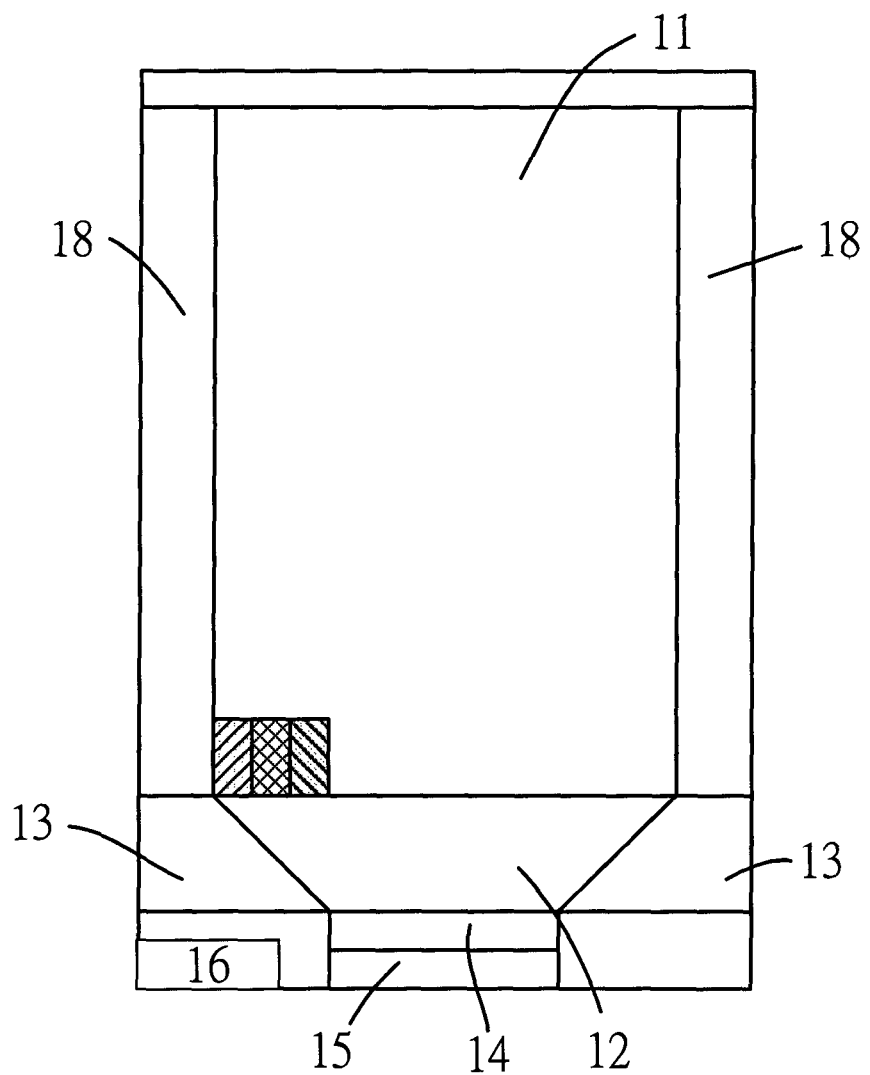
FIG. 1 is an illustrative diagram of a baseplate circuit of a conventional display panel.
Figure 2:
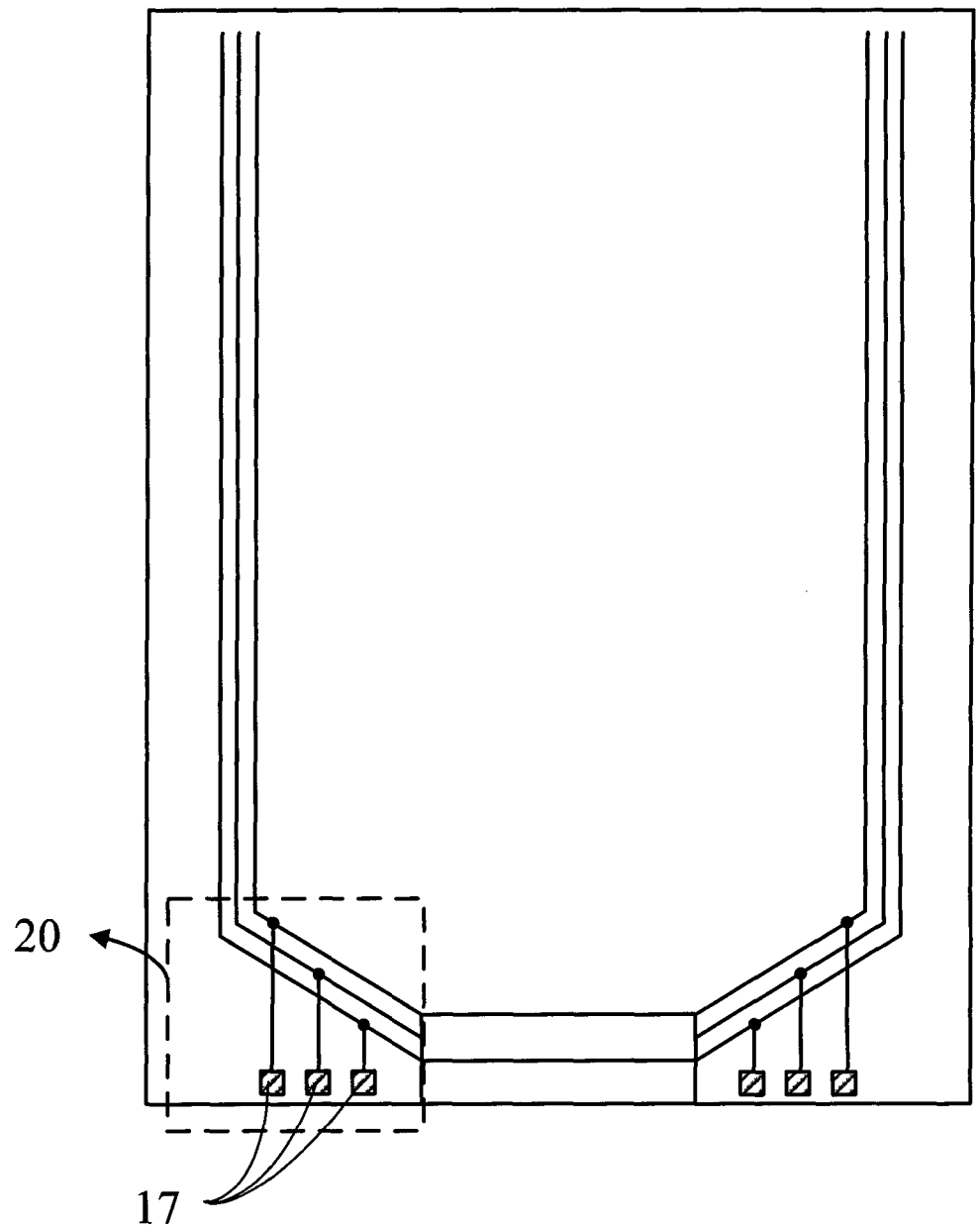
FIG. 2 is an illustrative drawing of the pixel test circuit of FIG. 1.

The following description of each embodiment, with reference to the accompanying drawings, is used to exemplify specific embodiments which may be carried out in the present invention. Directional terms mentioned in the present invention, such as "top", "bottom", "front", "back", "left", "right", "inside", "outside", "side", etc., are only used with reference to the orientation of the accompanying drawings. Therefore, the used directional terms are intended to illustrate, but not to limit, the present invention. In the drawings, units with similar structures are marked with the same labels.

Figure 3:
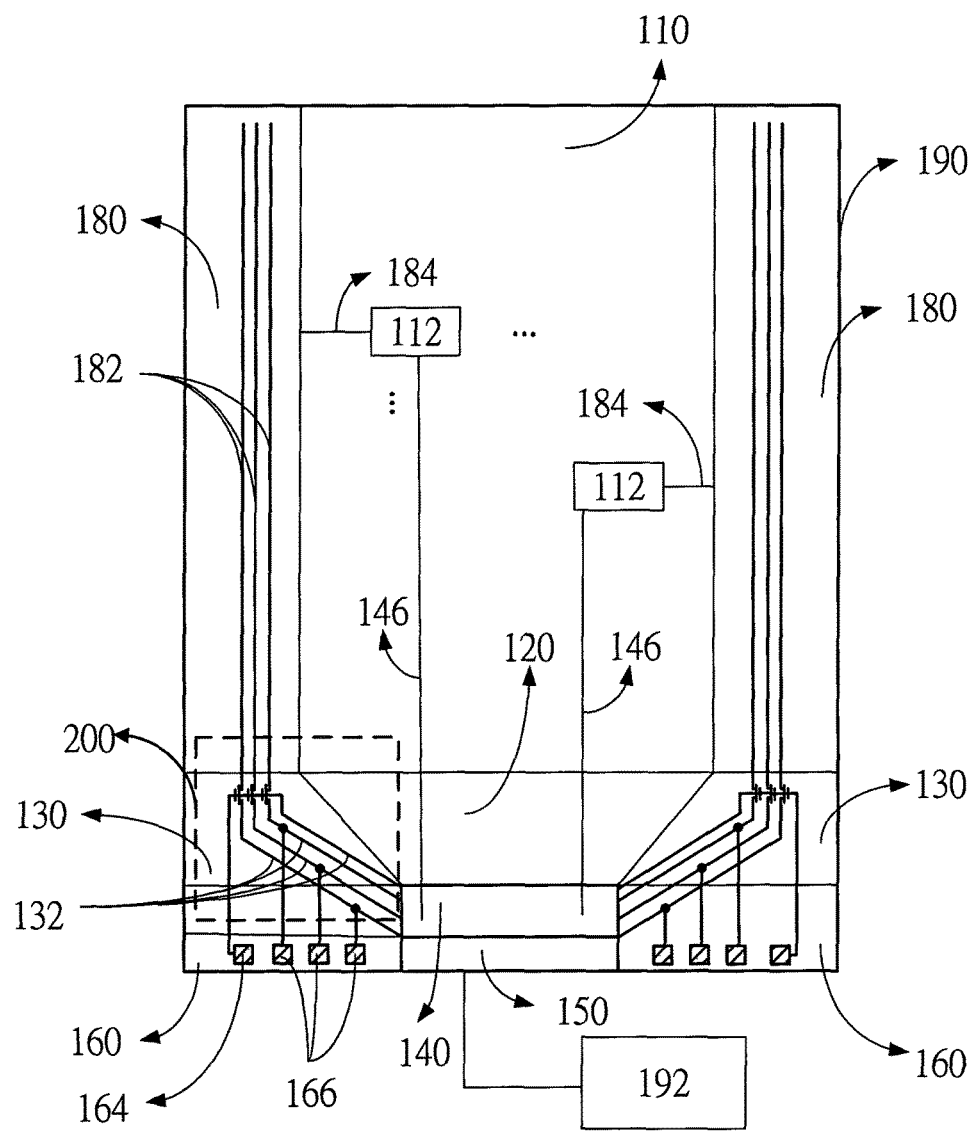
FIG. 3 is an illustrative diagram of a baseplate circuit of the present invention.

FIG. 3 is an illustrative diagram of a baseplate circuit 100 of the present invention. The baseplate circuit 100 is disposed in a baseplate 190. The baseplate 100 comprises an active region 110, a plurality of GOA regions 180, an external connecting region 120, a plurality of WOA regions 130, an IC region 140, a FPC region 150, a plurality of pixel testing regions 160, and a plurality of switches 162. The FPC region 150 is used to connect with an external assembly module 192 (main board). The IC region 140 electrically connects with the FPC region 150. Each WOA region 130 comprises a plurality of baseplate conducting wires 132, each of the baseplate conducting wires 132 is electrically connected with the IC region 140. Each GOA region 180 comprises a plurality of gate lines 182, each of the gate lines 182 is electrically connected with one of the baseplate conducting wires 132. The active region 110 is used to connect with the GOA regions 180. The active region 110 comprises a plurality of pixel units 112, the pixel units 112 is connected with the GOA regions 180 and a plurality of data lines 146 of the IC region 140. In detail, the pixel units 112 are electrically connected with a plurality of driving signal lines 184 of the GOA region 180. The external connecting region 120 is used to accommodate the data lines 146, which are used to connect the active region 110 and the IC region 140. Each pixel testing region 160 comprises a first testing pad 164 and a plurality of second testing pads 166. The GOA regions 180, the WOA regions 130, and the IC region 140 constitute a pixel testing circuit 200.

In the embodiment, the baseplate 190 may be a glass baseplate. The baseplate 190 further comprises a main board 192, which is used to connect the FPC region 150 and provide the information which the baseplate circuit 100 need.

Figure 4:
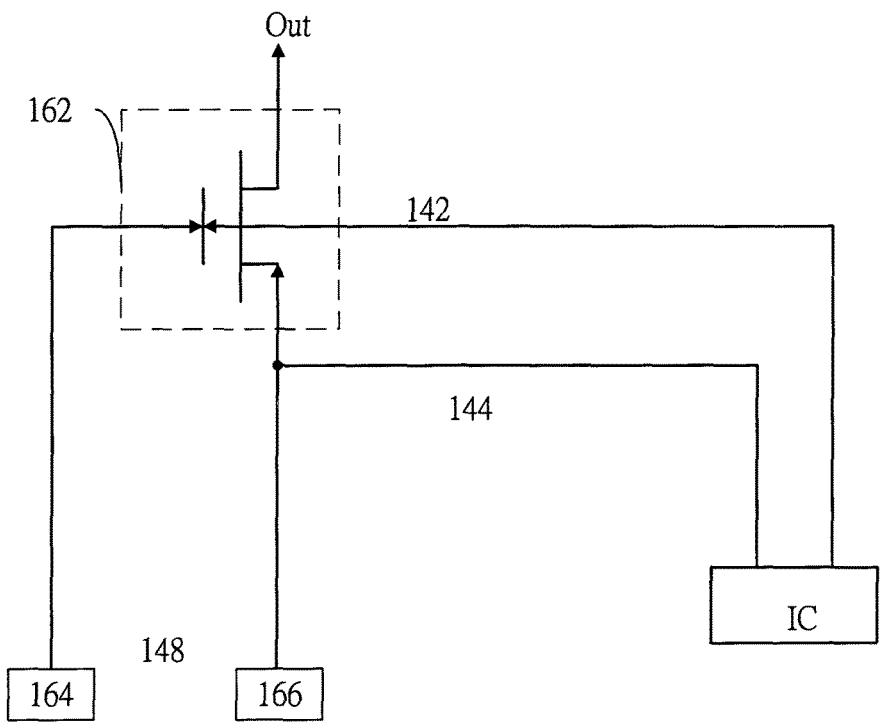
FIG. 4 is an illustrative drawing of the pixel test circuit of FIG. 3.

FIG. 4 is an illustrative drawing of the pixel test circuit 200 of FIG. 3. In the embodiment, the switches 162 are TFTs. Each switch 162 comprises a first terminal, a second terminal, and a control terminal. The first terminal connects with one of the baseplate conducting wires 132, the second terminal connects with one of the gate lines 182. In detail, the first terminal is a source electrode, the second terminal is a drain electrode, and the control terminal is a gate electrode. The first testing pad 164 and the IC region 140 are electrically connected with the control terminal of the switch 162. The second testing pads 166 are respectively connected with the first terminals of the switch 162. According to testing requests, the IC region 140 outputs a control signal 142, which is used to selectively switch on/off the switches 162. This is the reason why the present invention is able to effectively determine whether the problem is in the GOA regions 180 or in the WOA regions 130. As FIG. 4 shows, while the pixel testing circuit 200 performs a measurement on a testing signal 144 through a high RC loading of the WOA regions 130 and the GOA regions 180, the control signal 142 transmitted from the IC region 140 turns on the switch 162; while the pixel testing circuit 200 performs a measurement on the testing signal 144 through a low RC loading of the WOA regions 130, the control signal 142 transmitted from the IC region 140 turns off the switch 162, to avoid an influence caused by the RC loading of the GOA regions 180.

Figure 5:
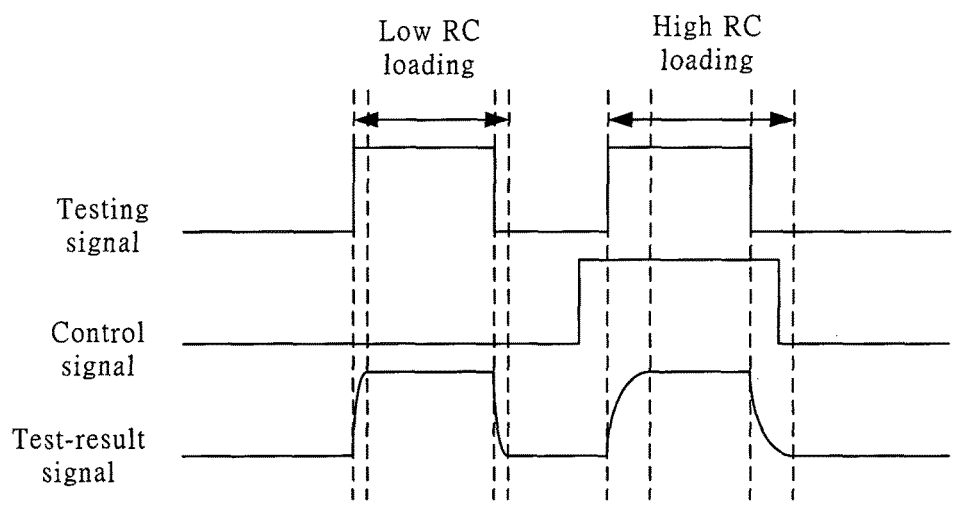
FIG. 5 is an operational time-domain diagram of baseplate circuit during actual operation of the baseplate circuit of FIG. 3.

FIG. 5 is an operational time-domain diagram of baseplate circuit during actual operation of the baseplate circuit of FIG. 3. According to the time-domain diagram, it is able to control of outputting a waveform of a test-result signal 148 by the control signal 142. While the control signal 142 is at a high voltage status, the panel performs a normal drive, the test-result signal 148 is a waveform after passing through the high RC loading of the WOA regions 130 and the GOA regions 180. While the control signal 142 is at a low voltage status, the panel performs no drive, the test-result signal 148 is a waveform after passing through the low RC loading of the WOA regions 130. When a measured high RC loading signal is not able to satisfy the driving of gate lines, with comparison of the waveforms of low RC loading and high RC loading, it is easy to determine the malfunctioned region (WOA region or GOA region), and will be a powerful reference for product design. For example, if the two waveforms are similar, it is needed to decrease the RC loading of the WOA regions 130. If the two waveforms are too different, it is needed to decrease the RC loading of the GOA regions 180 or change the IC with a stronger driving capability.

Although the present invention has been disclosed as preferred embodiments, the foregoing preferred embodiments are not intended to limit the present invention. Those of ordinary skill in the art, without departing from the spirit and scope of the present invention, can make various kinds of modifications and variations to the present invention. Therefore, the scope of the claims of the present invention must be defined.

What is claimed is:

1. A baseplate circuit, disposed in a baseplate, the baseplate circuit comprising:
    an IC (Integrated Chip) region;
    a plurality of WOA (Wire On Array) regions, each of the WOA regions comprising a plurality of baseplate conducting wires, each of the baseplate conducting, wires being electrically connected with the IC region;
    a plurality of GOA (Gate On Array) regions, each of the GOA regions comprising a plurality of gate lines, each of the gate lines being electrically connected with one of the baseplate conducting wires;
    a plurality of switches, each of the switches being used to directly electrically connect one of the gate lines and one of the baseplate conducting wires;
    an active region, being used to connect with the GOA regions, the active region comprising a plurality of pixel units, the pixel units being connected with the GOA regions and a plurality of data lines of the IC region;
    a FPC (Flexible Printed Circuit) region, being used to connect with an external assembly module; and
    an external connecting region, being used to accommodate the data lines, being used to connect the active region and the IC region;
    wherein the IC region outputs a control signal used to selectively switch on/off the switches, the IC region further outputs a testing signal used to pass through the WOA regions and the GOA regions or the WOA regions only, according to the control signal, the baseplate is a glass baseplate.

2. The baseplate circuit according to claim 1, wherein each of the switches comprises a TFT (thin film transistor), the TFT comprises a first terminal, a second terminal, and a control terminal, the first terminal connects with one of the baseplate conducting wires, the second terminal connects with one of the gate lines.

3. The baseplate circuit according to claim 2, wherein the baseplate circuit further comprises a plurality of pixel testing regions, each of the pixel testing regions comprises:
    a first testing pad, being used to electrically connect the control terminal and the IC region; and
    a plurality of second testing pads, each of the second testing, pads being electrically connected with the first terminal of the TFT.

4. The baseplate circuit according to claim 2, wherein the first terminal is a source electrode, the second terminal is a drain electrode and the control terminal is a gate electrode.

5. A baseplate circuit, disposed in a baseplate, the baseplate circuit comprising:
    an IC region;
    a plurality of WOA regions, each of the WOA regions comprising a plurality of baseplate conducting wires, each of the baseplate conducting wires being electrically connected with the IC region;
    a plurality of GOA regions, each of the GOA regions comprising a plurality of gate lines, each of the gate lines being electrically connected with one of the baseplate conducting wires; and
    a plurality of switches, each of the switches being used to directly electrically connect one of the gate lines and one of the baseplate conducting wires;

the IC region outputs a control signal used to selectively switch on/off the switches, the IC region further outputs a testing signal used to pass through the WOA regions and the GOA regions or the WOA regions only, according to the control signal, the baseplate is a glass baseplate.

6. The baseplate circuit according to claim 5, wherein the baseplate circuit further comprises an active region, being used to connect with the GOA regions, the active region comprises a plurality of pixel units, the pixel units being connected with GOA regions and a plurality of data lines of the IC region.

7. The baseplate circuit according to claim 5, wherein the baseplate is a glass baseplate.

8. The baseplate circuit according to claim 5, wherein the baseplate circuit further comprises a FPC region being used to connect with an external assembly module.

9. The baseplate circuit according to claim 5, wherein the baseplate circuit further comprises an external connecting region being used to accommodate the data lines, the data lines being used to connect the active region and the IC region.

10. The baseplate circuit according to claim 5, wherein each of the switches comprises a TFT (thin film transistor), the TFT comprises a first terminal, a second terminal, and a control terminal, the first terminal connects with one of the baseplate conducting wires, the second terminal connects with one of the gate lines.

11. The baseplate circuit according to claim 10, wherein the baseplate circuit further comprises a plurality of pixel testing regions, each of the pixel testing regions comprises:
   a first testing pad, being used to electrically connect the control terminal and the IC region; and
   a plurality of second testing pads, each of the second testing pads being electrically connected with the first terminal of the TFT.

12. The baseplate circuit according to claim 10, wherein the first terminal is source electrode, the second terminal is drain electrode and the control terminal is a gate electrode.

13. The baseplate circuit according to claim 5, wherein the IC region outputs a control signal used to selectively switch on/off the switches.

14. A display panel, which comprising a baseplate circuit and a main board, wherein the main board connects with the baseplate circuit and provides display information which the baseplate needs, the baseplate circuit comprising:
   an IC region;
   a plurality of WOA regions, each of the WOA regions comprising a plurality of baseplate conducting wires, each of the baseplate conducting wires being electrically connected with the IC region;
   a plurality of GOA regions, each of the GOA regions comprising a plurality of gate lines, each of the gate lines being electrically connected with one of the baseplate conducting wires;
   a plurality of switches, each of the switches being used to directly electrically connect one of the gate lines and one of the baseplate conducting wires;
   an active region, being used to connected with the GOA regions, the active region comprises a plurality of pixel units, the pixel units being connected with GOA regions and a plurality of data lines of the IC region;
   a FPC region being used to connect with an external assembly module; and
   an external connecting region being used to accommodate the data lines, the data lines being used to connect the active region and the IC region;
   wherein the IC region outputs a control signal used to selectively switch on/off the switches, the IC region further outputs a testing signal used to pass through the WOA regions and the GOA regions or the WOA regions only, according to the control signal, the baseplate is a glass baseplate.

15. The baseplate circuit according to claim 14, wherein each of the switches comprises a TFT, the TFT comprises a first terminal, a second terminal, and a control terminal, the first terminal connects with one of the baseplate conducting wires, the second terminal connects with one of the gate lines.

16. The baseplate circuit according to claim 15, wherein the baseplate circuit further comprises a plurality of pixel testing regions, each of the pixel testing regions comprises:
   a first testing pad being used to electrically connect the control terminal and the IC region; and
   a plurality of second testing pads, each of the second testing pads being electrically connected with the first terminal of the TFT.

17. The baseplate circuit according to claim 15, wherein the first terminal is a source electrode, the second terminal is a drain electrode and the control terminal is a gate electrode.

* * * * *